United States Patent [19]
Leedy

[11] Patent Number: 5,512,397
[45] Date of Patent: *Apr. 30, 1996

[54] STEPPER SCANNER DISCRETIONARY LITHOGRAPHY AND COMMON MASK DISCRETIONARY LITHOGRAPHY FOR INTEGRATED CIRCUITS

[76] Inventor: Glenn J. Leedy, 1061 E. Mountain Dr., Santa Barbara, Calif. 93108

[*] Notice: The term of this patent shall not extend beyond the expiration date of Pat. No. 4,924,589.

[21] Appl. No.: 146,470

[22] Filed: Nov. 2, 1993

Related U.S. Application Data

[63] Continuation of Ser. No. 838,157, Feb. 18, 1992, abandoned, which is a continuation-in-part of Ser. No. 775,324, Oct. 11, 1991, Pat. No. 5,225,771, which is a division of Ser. No. 482,135, Feb. 16, 1990, Pat. No. 5,103,557, which is a continuation-in-part of Ser. No. 194,596, May 16, 1988, Pat. No. 4,924,589.

[51] Int. Cl.$^6$ .................................................. G03F 7/20
[52] U.S. Cl. ........................ 430/30; 430/311; 430/313; 430/394; 430/396
[58] Field of Search .................... 430/30, 311, 313, 430/319, 327, 394, 396

[56] References Cited

U.S. PATENT DOCUMENTS

| | | | |
|---|---|---|---|
| Re. 33,836 | 3/1992 | Resor | 355/43 |
| 3,405,361 | 10/1968 | Kattner | 324/158 |
| 3,618,201 | 11/1971 | Makimoto et al. | 29/574 |
| 3,702,025 | 11/1972 | Archer | 29/574 |
| 3,835,530 | 9/1974 | Kilby | 29/574 |
| 4,038,599 | 7/1977 | Bove et al. | 324/158 F |
| 4,065,717 | 12/1977 | Kattner et al. | 324/158 P |
| 4,070,565 | 1/1978 | Borrelli | 235/302 |
| 4,566,184 | 1/1986 | Higgins et al. | 29/840 |

(List continued on next page.)

FOREIGN PATENT DOCUMENTS

| | | | |
|---|---|---|---|
| 0114211A2 | 11/1983 | European Pat. Off. | 23/52 |
| 0230348A2 | 1/1987 | European Pat. Off. | 1/73 |
| 2833780 | 2/1980 | Germany . | |
| WO89/11659 | 11/1989 | WIPO . | |

OTHER PUBLICATIONS

Wafer Scale Integration–Historical Perspective, N. R. Strader et al., (date unknown).
"Plastics That Conduct Electricity", R. B. Kaner and A. G. MacDiarmid, Scientific American, pp. 106–111, Feb. 1988.
IBM Tech. Discl. Bul., vol. 21, No. 10, K. S. Desai, et al., "Method for Eliminating Paste Pull–Out of Screened Green Sheet" pp. 4029–4030.
Microelectronics and Reliability, vol. 25, No. 4, 1985, A. Singh, et al,. "Technique for Lifting Off Thick Film Print Fired on Alumina", pp. 619–620.

*Primary Examiner*—Kathleen Duda
*Attorney, Agent, or Firm*—Blakely, Sokoloff Taylor, Zafman

[57] ABSTRACT

Large scale integrated circuits are fabricated using redundant circuit elements to replace defective circuit elements by discretionary interconnect changes as determined by fine-grain testing of the integrated circuits after the logic units (such as individual transistors or logic gates) are fabricated and before they are electrically interconnected. The redundant circuit elements are then interconnected to non-defective circuit elements by one of two methods. In the first method a stepper-scanner apparatus modified to expose most of a resist layer defines the interconnect circuitry, but is shuttered-off over the discretionary interconnect changes. Then the discretionary interconnect changes are exposed by a conventional direct write on wafer pattern generation apparatus. In the second method, the interconnect patterning is accomplished by first fabricating a fixed custom mask defining the interconnect layer for a particular lot size (such as 100) of wafers. The fixed mask is fabricated after each wafer of the lot has been tested, and incorporates all the discretionary changes required to avoid interconnection to each defective circuit element in each of the wafers. The fixed custom mask is then used to expose the resist layer defining the interconnect circuitry for each of the 100 wafers.

22 Claims, 2 Drawing Sheets

U.S. PATENT DOCUMENTS

| | | | |
|---|---|---|---|
| 4,573,008 | 2/1986 | Lischke | 324/158 |
| 4,574,235 | 3/1986 | Kelly et al. | 324/158 F |
| 4,585,727 | 4/1986 | Reams | 430/312 |
| 4,590,422 | 5/1986 | Milligan | 324/158 F |
| 4,617,730 | 10/1986 | Geldermans et al. | 29/843 |
| 4,636,722 | 1/1987 | Andezzone | 324/158 P |
| 4,644,264 | 2/1987 | Beha et al. | 324/73 R |
| 4,647,851 | 3/1987 | Dugan | 324/158 P |
| 4,649,338 | 3/1987 | Dugan | 324/158 P |
| 4,649,339 | 3/1987 | Grangroth et al. | 324/158 F |
| 4,686,112 | 8/1987 | Hoffman | 427/42 |
| 4,697,143 | 9/1987 | Lockwood et al. | 324/158 P |
| 4,715,928 | 12/1987 | Hamby | 156/630 |
| 4,755,747 | 7/1988 | Sato | 324/158 F |
| 4,799,009 | 1/1990 | Tada et al. | 324/158 P |
| 4,814,283 | 3/1989 | Temple et al. | 437/8 |
| 4,820,976 | 4/1989 | Brown | 324/158 F |
| 4,853,627 | 8/1989 | Gleason et al. | 324/158 P |
| 4,891,585 | 1/1990 | Janko et al. | 324/158 P |
| 4,924,589 | 5/1990 | Keedy | 29/832 |

STEPPER SCANNER DISCRETIONARY LITHOGRAPHY AND COMMON MASK DISCRETIONARY LITHOGRAPHY FOR INTEGRATED CIRCUITS

CROSS REFERENCE TO PRIOR APPLICATIONS

This application is a continuation of application Ser. No. 07/838,157, filed Feb. 18, 1992, now abandoned. Which is a continuation-in-part of U.S. patent application Ser. No. 07/775,324, filed Oct. 11, 1991, now U.S. Pat. No. 5,225,771, which is a divisional of U.S. patent application Ser. No. 07/482,135, filed Feb. 16, 1990, (now U.S. Pat. No. 5,103,557, and incorporated by reference) which is a continuation-in-part of U.S. patent application Ser. No. 07/194,596, filed May 16, 1988, (now U.S. Pat. No. 4,924,589 and incorporated by reference).

BACKGROUND OF THE INVENTION

1. Field of the Invention

A first method described here is for discretionary fine-grain resist layer patterning in situ to a fixed mask pattern exposure for fabrication of integrated circuits, and a second method described here requires the fabrication of a custom mask to pattern on each wafer a discretionary layer incorporating all discretionary changes for a specific lot of wafers.

2. Description of the Prior Art and Related Prior Patents

Integrated circuits (ICs) include active and passive elements such as transistors, diodes, resistors, and capacitors, that are interconnected in a predetermined pattern to perform desired functions. The interconnections are effectuated by means of metallization layers and vias. A "via" is a hole through an insulation layer in which conductor material is located to electrically interconnect one conductive layer to another or to an active or passive region in the underlying semiconductor substrate. Present day technology generally employs two metallization layers that are superimposed over the semiconductor wafer structure. Integrated circuits and assemblies have become more complex with time and in a logic circuit, the number of integrated circuit logic units (ICLUs) and interconnects on a given size die have been substantially increased reflecting improved semiconductor processing technology. An ICLU is an IC element and can be a device (such as a transistor), a gate (several transistors) or as many as 25 or more transistors and other devices. As is well known in the art, each ICLU is connected to other ICLUs by conductive contact points which have a typical center-to-center spacing of about 6 to 15 microns ($\mu$m).

Standard processing to make logic structures (e.g., gate arrays) includes first fabricating as many as half a million transistors comprising a quarter of a million gates per die. Each semiconductor wafer (typically silicon but sometimes of other material such as gallium arsenide) includes many die, for example, several hundred. In one type of gate array, for example, the transistors are arrayed in rows and columns on each die, and each transistor is provided with conductive contact points (typically metal but sometimes formed of other conductive material such as doped polycrystalline silicon), also arrayed in rows and columns.

In the prior art, the next step is to use fixed masks to fabricate the conductive layers (sometimes called "metallization layers"), to connect together the individual gate-array devices. Typically two or sometimes three metallization layers are used.

After this, the completed die is tested. If any of the devices on the die are defective, that die will fail an exhaustive test and be scrapped. Therefore, the more transistors per die the lower the manufacturing yield. In some cases redundant sections of a circuit are provided that can be substituted for defective sections of a circuit by fuses after metallization. Typically such redundant sections can be 5% to 10% of the total circuit.

As stated above, the prior art fabricates a plurality of transistors on a die, interconnects the transistors to form desired logic, tests the entire die, and scraps the die if the logic doesn't work. In the contrasting methods as disclosed in the related patents listed above, after fabricating the transistors exactly as before, the transistors or ICLUs are tested individually (see related patents listed above for details.). Then the interconnect scheme is modified, if necessary, by CAD means (of well known design) to bypass defective transistors or ICLUs and substitute, logically speaking, replacement (redundant) ICLUs. Then the metallization layers are deposited and patterned in accordance with the modified interconnect scheme, in one embodiment by E-beam (Electron-beam) lithography, instead of the masking process of the usual conventional technology. Thus each die has its own unique interconnect scheme, even though each die is to carry out the same function as the other die.

One begins with a gate array IC conventionally fabricated on a silicon or GaAs wafer although standard cell or full custom IC designs can just as easily be used. The gate array transistors are arrayed in columns and rows on the wafer surface 1 of FIG. 1a, and the active regions of each transistor are provided with contact points such as 2-1 to 2-32 which are in columns and rows as shown in FIG. 1b (not all contact points are numbered). FIG. 1b is an enlarged view of the portion of FIG. 1a shown in the circle marked "1b". Redundant (or extra) devices are designed into each column, with a redundancy factor dependent on the expected yield of the individual transistors or ICLUs being tested.

The surface of the wafer 1 is optionally planarized with a cured layer of polyimide 0.8 to 1.5 micron thick if the step heights between contact points are greater than 0.5 microns. (The contact points 2-1 to 2-32 are masked from the polyimide layer, to create a via over each contact point free of polyimide, and metal is deposited to fill the via.)

The fabricated (but not metallized) wafer 1 is now ready for testing. Sometimes only one column of transistors on each die is tested at a time; testing more than one column, the whole die or several die per step is also possible. For a die of typical complexity this requires making contact with all of the perhaps 10,000 or so contact points such as 2-1 to 2-4 in one column simultaneously, and then stepping across all 100 or 200 or more columns in each die, to exhaustively test each die in step-and-repeat fashion. Each contact point such as 2-1 is small such as usually 4×4 microns in area. Each wafer contains a plurality of die, the exact number depending on the size of the wafer but typically being in the hundreds.

The data resulting from the testing is a list of the location of each of the defective transistors or ICLUs. This list is automatically communicated to a conventional CAD system from a tester signal processor. The CAD system then, by special software algorithms, works out interconnect changes for each die. Each interconnect change required due to a defective ICLU typically affects ICLU interconnects over an area of no greater than 100 µm in diameter. Therefore, the master placement scheme of the net list is modified in terms of the placement of the defective ICLUs so as to bypass the defective ICLUs and interconnect defect-free ICLUs from the stock of redundant ICLUs.

The above-mentioned related patents listed above (as described in detail therein) use two alternative software algorithms for interconnects: recomputation of metallization trace routing or a CAD rip-up router.

A modified routing database as provided by either of these methods is next used to produce the database for the desired interconnect patterns on the wafer using in one embodiment E-beam equipment. The metallization process is in one embodiment a two layer metallization, although a single layer of metallization or three or more layers of metallization can also be used. The metallization process involves depositing a layer of insulation, such as silicon dioxide, typically of about one micron thickness over the wafer surface, and cutting vias by means of a mask to the contact points on the wafer surface through the silicon dioxide layer. Then a layer of metal, typically aluminum, is deposited over the silicon dioxide. Then a layer of photoresist is deposited and patterned, for example using E-beam (maskless) lithography. The E-beam is controlled by the CAD database means and its modified net list to make the desired interconnect pattern corrected in accordance with the test results. The photoresist is then developed and removed where exposed to the E-beam (if positive resist), allowing the patterning of the interconnects as desired.

The metallization (i.e., interconnect) process is then repeated for the second metallization layer and any subsequent metallization layers. The metallization process is generally well known technology.

At this point the wafer is complete, ready for scribing, packaging and final test as usual.

SUMMARY OF THE INVENTION

An object of this invention is to permit the fabrication of very large integrated circuits, in terms of the number of ICLUs or devices per circuit.

The first method uses a stepper-scanner apparatus modified to expose most of a resist layer defining the interconnect circuitry, but the exposure is interrupted or shuttered-off at the locations of the discretionary interconnect changes. In a later step the discretionary interconnect changes are exposed by a conventional direct write-on-wafer pattern generation apparatus.

In the second method, the interconnect patterning is accomplished in two main steps. First one or more fixed masks (typically two, one metal and one via mask) for the mask layers requiring modification is fabricated for defining the interconnect layer for a particular lot (such as 100) of wafers. The fixed masks are fabricated after each wafer has been exhaustively tested, and the fixed masks incorporate all the discretionary changes required to avoid interconnection to each defective circuit element in all of the 100 wafers. The fixed custom masks are then used to expose the resist layer defining the interconnect circuitry for all of the 100 wafers.

The present invention improves on the above-described art by making fabrication of the metallization (interconnect) faster and hence less expensive than by patterning the entire interconnect by E-beam. Prior methods require the separate application and processing of more than one resist layer, and/or two separate etch processing steps of the same metal layer or via layer. The present methods cost (depending on lot size) less than ¼ as much as the non-E-beam methods and less than 1/20 of an all E-Beam pattern generation (direct write) method.

DETAILED DESCRIPTION OF THE INVENTION

Figure 1A:
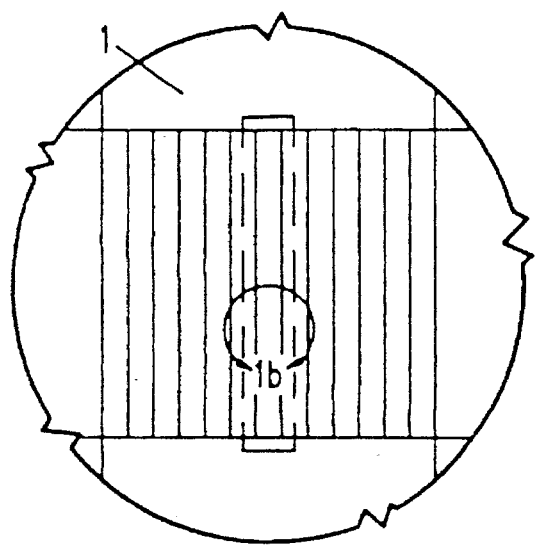
FIGS. 1a and 1b show a section of a gate array wafer and the device contacts.
Figure 1B:
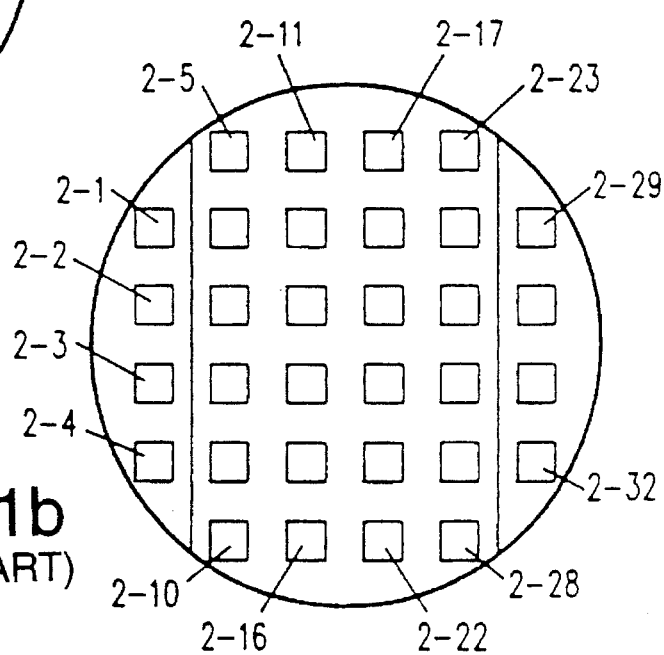

In accordance with the present invention, instead of using the results of the recomputation of metallization trace routing or a CAD rip-up router as described above to pattern the interconnect using E-beam maskless lithography as in one embodiment, the interconnect is fabricated by one of the two following methods both of which involve the use of fixed mask(s).

STEPPER SCANNER DISCRETIONARY LITHOGRAPHY

This first method uses the fine-grain IC CAD and ICLU defect test databases generated as described above and in the related patents listed above to prevent the exposure of a fixed mask pattern over the defective ICLU sites during the exposure of a fixed mask. The IC CAD and ICLU defect databases are used to compute the definition (dimension) and location of discretionary areas of the fixed mask image that are not to be exposed or imaged during the primary exposure of the fixed mask onto the resist of the substrate.

The ICLU defect database identifies by locator index (e.g. row m, column n) or identification index a defective ICLU of a specific die. This index is then used to look up the physical dimension of the ICLU in the IC CAD database. All layout specific information and even the identification and routing connections of the redundant ICLU to be used to replace the defective ICLU may be provided by the IC CAD database. The dimensions to be used for the defective replacement ICLU are typically directly read from the IC CAD database, or can be easily computed from the placement coordinates of adjacent ICLUs.

The discretionary areas of the resist layer that are not imaged during the primary exposure or imaging of the fixed mask are subsequently imaged by an optical pattern generating lithography tool or a non-optical patterning generating lithography tool such as E-beam or Ion-beam equipment. The control of the exposure of discretionary areas by these lithography tools with regard to fixed mask and pattern generation processing is derived from the IC CAD and ICLU defects databases. This is done in the same manner used conventionally for reducing a complete IC mask layer into pattern generation instructions for a mask making tool, the difference here only being that a very small subset of a mask layer is being processed.

This discretionary lithography method derives its advantage from the fine-grain nature of the tester ICLU defect database. The IC CAD and fine-grain ICLU defect databases provide the information to determine definition and placement of rectangular areas in the fixed mask pattern of a layer of an IC that requires discretionary imaging. The size of these areas is small, typically less than 100 µm by 100 µm and they are few in number, there being typically less than two per $cm^2$ or whatever the defect density of the semiconductor process that is being employed. The small area of each ICLU defect and the low ICLU defect density provide the basis for utilizing fixed mask lithography and not requiring the generation of a separate mask pattern. Due to the short length and local nature of each discretionary interconnect change, the electrical operational parameters of the IC are unaffected, or these circuit parameters remain within the band-width of the original circuit timing simulation. Discretionary changes in situ to the imaged pattern of the fixed mask are achieved in a common resist layer. This method requires no additional resist application or etch processing steps other than those already required by the IC fabrication process being employed.

This method of fine-grain discretionary lithography uses a commercially available lithography tool called a stepper scanner. This newly developed lithography tool operates in a manner identical to conventional stepper lithography tools except instead of imaging the complete IC layer during resist exposure with a fixed mask, it exposes the resist layer with the pattern of a fixed mask by making incremental exposure scans or strips across the mask image until the complete mask area has been imaged onto the resist. These exposure scans dimensionally are the length of the mask and of variable width from 1 to several mils. In one embodiment the exposure scans have variable widths ranging from 1 to 5 mils. Stepper scanner tools as now commercially available do not operate so as to prevent the exposure of the discretionary areas. However, these tools can easily be modified to do so by methods well within the knowledge of one skilled in the art. Such equipment is presently offered for sale by Silicon Valley Group, (Santa Clara, Calif.) and Image Micro Systems, Inc. (Billerica, Mass.); several other lithography equipment manufacturers are expected soon to offer such equipment.

The modification of these tools is as follows. The placement or position and length of an ICLU in an exposure scan or strip is provided as data to the stepper-scanner tool. The exposure of the scan is shuttered or blocked from the left edge of the ICLU of interest to the right end of the scan. This exposes the area of the scan to the left of the ICLU of interest. A second scan exposure is made, and the area from the left end of the scan to the right edge of the ICLU of interest is shuttered or blocked. This exposes the area to the right of the ICLU. This is only one of several methods possible. All that is required to implement this method is a left and right shutter vane under the same computer control as the scanning stepper, and reading the discretionary ICLU exposure data. In some cases it will be necessary to change the height of the scan. This is accomplished under the same computer control and using the ICLU data. Shutter vanes capable of high precision vertical motion are used to adjust the height of the scan exposure.

Figure 2:
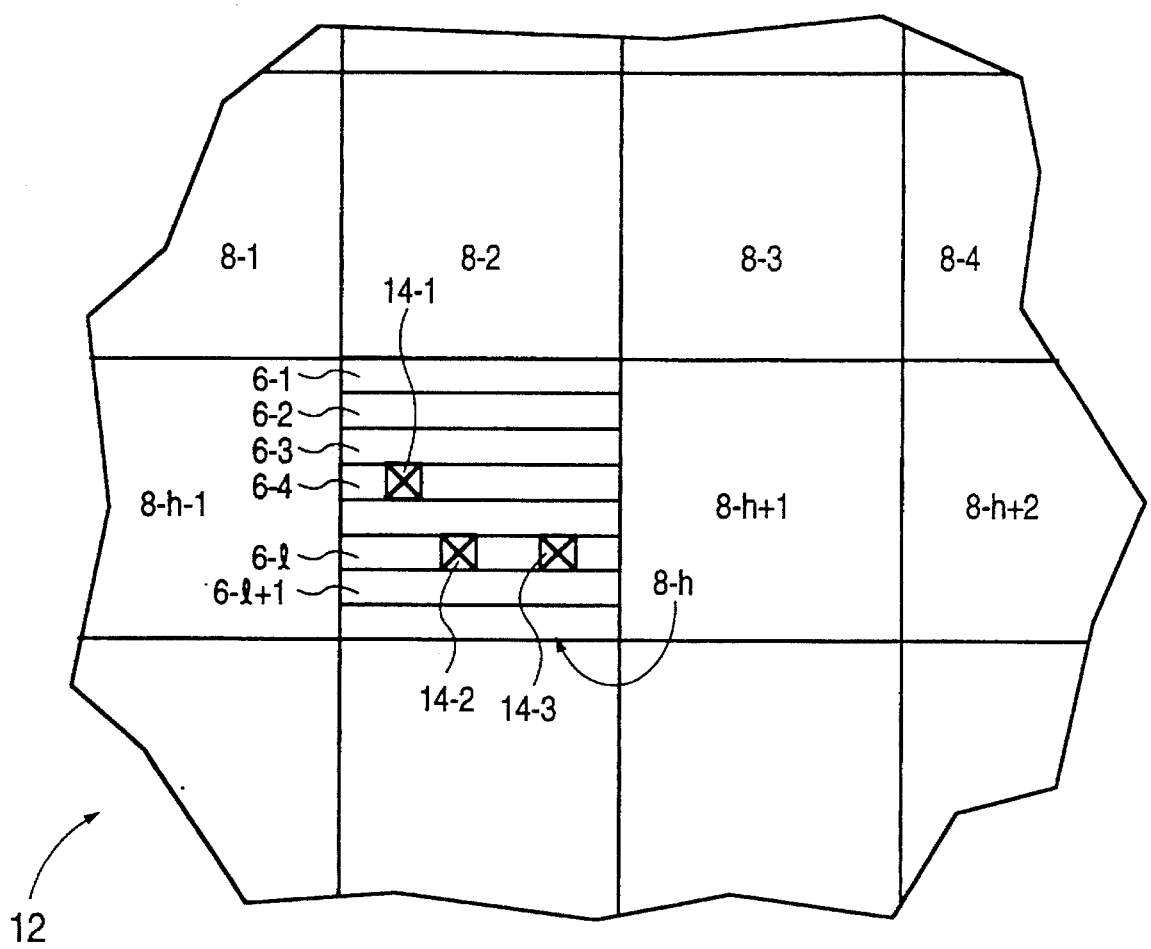
FIGS. 2 shows stepper scanner discretionary lithography.

FIG. 2 shows scan exposures 6-1, 6-2, . . . , 6-1, 6-1+1, . . . of an individual IC 8-k on a substrate 12 containing multiple ICs 8-1, 8-2, . . . , 8-k−1, 8-k, 8-k+1, . . . during fabrication. The marked areas 14-1, 14-2, 14-3 indicate discretionary areas (not to scale) that were not exposed during the scanning of the IC 8-k with a fixed mask. Each IC 8-k would be expected to have a slightly different placement of discretionary areas consistent with the occurrences of defects within an individual IC.

The application of this stepper scanner lithography tool to fine-grain discretionary resist patterning is accomplished as follows. The scanner stepper lithography tool is programmed with the width of the scan exposure 6-1 based on each defective ICLU 14-2, 14-3 placement and dimensional data. The exposing scan is positioned to have coincident edges with the upper and lower rectangular edges of the boundaries of each fine-grain discretionary area 14-1, 14-2, 14-3 containing an ICLU defect and the redundant ICLU (not shown) to be used to repair or replace each defective ICLU 14-1, 14-2, 14-3. The exposure scan 6-1 is then interrupted or shuttered-off when the exposure scan of a fixed mask (not shown) is directly over a fine-grain discretionary or defect area 14-1, 14-2, 14-3. This leaves the resist over the area of the defective ICLU 14-1, 14-2, 14-3 and its redundant replacement unpatterned, but all of the remaining portions of the fixed mask are conventionally imaged onto the resist layer (not shown) of the IC substrate 12.

The unpatterned discretionary areas 14-1, 14-2, 14-3 of the resist layer are then patterned with a pattern generating tool. Direct write-on-wafer pattern generation tools that can be used to pattern the resist in a discretionary area are presently manufactured by such companies as Research Devices (Piscataway, N.J.), Ateq (Beaverton, Ore.), Etec Systems (Hayward, Calif.), and Seiko Instruments (Japan). The image of the resist is then transferred into the substrate 12 using whatever manner of semiconductor process technology that has been chosen.

COMMON MASK DISCRETIONARY LITHOGRAPHY

This alternative method takes advantage of the statistical phenomenon that the likelihood of an ICLU defect also occurring in the redundant or replacement ICLU at some location more than once for all die in some particular lot size of wafers (such as 10 to 1,000 wafers) of a specific IC is near zero. This statistical phenomenon depends on the defect density of the semiconductor process technology being used, but is attributable to the fine-grain resolution of the ICLU test database. This method achieves discretionary changes through lithography processing by creating one or more fixed masks that incorporate all discretionary changes required by each defective ICLU for some number of wafers of a specific IC design. In this manner the cost of creating custom masks to accommodate discretionary interconnect metallization changes is averaged over the number of ICs that yield from a specific wafer lot size.

In this method, after the ICLUs have all been fabricated on some fairly large number of wafers (such as 100 wafers), each ICLU of each wafer is tested for defects as described above. Then using the resulting ICLU defect data base, typically two custom fixed masks for providing the desired interconnects are conventionally fabricated, except that wherever any of the ICLUs on any of the 100 wafers has a defect, interconnects are provided on the fixed masks connecting instead to a redundant ICLU. The fixed masks are thus customized for this particular lot of wafers and all die of the wafer lot will have the same via and metallization pattern. Typically two fixed masks are used—one for metallization and one for vias for redundant ICLU interconnection. If the redundant ICLUs may be connected with only one mask, then only one fixed mask is needed.

The fixed masks are then used to expose a resist layer on each of the 100 wafers, leaving any surface area on any of the wafers that includes a defective ICLU excluded from the interconnect circuitry and substituting therefore one of the redundant ICLUs.

This description is illustrative and not limiting; further modifications will be apparent to one of ordinary skill in the art in the light of this disclosure and the appended claims.

I claim:

1. A method of fabricating integrated circuits comprising the steps of:

fabricating a plurality of integrated circuit logic elements on a principal surface of a substrate;

forming a resist layer overlying the integrated circuit logic elements:

testing each logic element and determining the presence of defects in each logic element;

determining the location and dimensions of each defect;

providing a fixed mask;

exposing said resist layer with a first exposure through said fixed mask to define electrical interconnects between the logic elements on said resist layer and leaving predetermined portions of said resist layer unexposed, wherein said predetermined portions left unexposed are defined by the location and dimensions of each defect;

exposing said resist layer with a second exposure to define electrical interconnects between the logic elements on said resist layer by exposing only the predetermined portions left unexposed in the preceding step; and interconnecting the logic elements according to the first and second exposures, thereby excluding the logic elements having defects from the interconnected logic elements.

2. The method of claim 1, wherein the step of exposing the resist layer with a first exposure includes the steps of:

scanning said resist layer in a plurality of scans of variable width; and interrupting the scanning at the predetermined portions, thereby leaving those predetermined portions unexposed.

3. The method of claim 2, wherein the steps of scanning and interrupting are performed by a stepper scanner modified to avoid exposing the predetermined portions corresponding to the defects as determined in the step of testing.

4. The method of claim 2, wherein the scans are of one widths about 1 to 5 mils.

5. The method of claim 1, wherein the step of exposing the resist layer with a second exposure comprises the step of:

using a direct write on wafer pattern generation tool to pattern the predetermined portions.

6. The method of claim 1 wherein each of said plurality of integrated circuit logic elements is a logic gate.

7. The method of claim 1 wherein each of said plurality of integrated circuit logic elements is a transistor.

8. The method of claim 1 wherein each defect is in a region of less than about 100 μm by about 100 μm.

9. The method of claim 1 wherein each defect is in a region of diameter less than about 100 μm.

10. The method of claim 1 wherein the step of testing each logic element includes the step of fine grain testing.

11. A method of fabricating integrated circuits comprising the steps of:

fabricating a plurality of integrated circuit logic elements on each of a plurality of substrates;

testing each logic element on each substrate to determine the presence of defects in each logic element and the location of each defect;

fabricating at least one fixed mask for the plurality of substrates, the fixed mask defining a fixed pattern to avoid patterning on logic elements including the defects on each substrate; and forming said fixed pattern on a conductive layer of each substrate as defined by the fixed mask, thereby interconnecting the logic elements and excluding from the interconnection all the logic elements which include defects.

12. The method of claim 11, wherein the step of fabricating at least one fixed mask includes fabricating one fixed mask for defining vias.

13. The method of claim 11 wherein the step of fabricating at least one fixed mask includes fabricating one fixed mask defining a metallization layer.

14. The method of claim 11 wherein each of said plurality of integrated circuit logic elements is a logic gate.

15. The method of claim 11 wherein each of said plurality of integrated circuit logic elements is a transistor.

16. The method of claim 11 wherein each defect is in a region of less than about 100 μm by about 100 μm.

17. The method of claim 11 wherein each defect is in a region of diameter less than about 100 μm.

18. The method of claim 11 wherein the step of testing each logic element includes the step of fine grain testing.

19. A method of fabricating integrated circuits comprising the steps of:

fabricating a plurality of integrated circuit logic elements on a substrate;

testing each logic element and determining the presence of defects in each logic element;

determining the location and dimensions of each defect;

providing a fixed mask;

exposing the substrate with a first exposure through said fixed mask to define electrical interconnects between the logic elements on a surface of the substrate, said first exposure being performed by scanning the fixed mask in a plurality of scans of variable width;

selectively interrupting the scanning thereby leaving predetermined portions of the surface of the substrate unexposed, wherein said predetermined portions left unexposed are defined by the location and dimensions of each defect;

then, exposing the substrate with a second exposure in the predetermined portions left unexposed in the preceding step; and interconnecting the logic elements according to the first and second exposures, thereby excluding the defects from the interconnected logic elements.

20. A method of fabricating integrated circuits comprising the steps of:

fabricating a plurality of integrated circuit logic elements on a substrate;

testing each logic element and determining the presence of defects in each logic element;

determining the location and dimensions of each defect;

providing a fixed mask;

defining electrical interconnects between the logic elements on a surface of the substrate with a first exposure by scanning the fixed mask in a plurality of scans of variable width using a stepper scanner modified to avoid exposing predetermined portions of the substrate corresponding to the defects as determined in the step of testing;

selectively interrupting the scanning thereby leaving the predetermined portions of the surface of the substrate unexposed, wherein the predetermined portions left unexposed are defined by the location and dimensions of each defect and the interrupting is performed by the modified stepper scanner;

exposing the substrate with a second exposure in the predetermined portions left unexposed in the preceding step; and interconnecting the logic elements according to the first and second exposures, thereby excluding the defects from the interconnected logic elements.

21. A method of fabricating integrated circuits comprising the steps of:

fabricating a plurality of integrated circuit logic elements on a substrate;

testing each logic element and determining the presence of defects in each logic element;

determining the location and dimensions of each defect;

providing a fixed mask;

defining electrical interconnects between the logic elements on a surface of the substrate with a first exposure by scanning the fixed mask in a plurality of scans of widths of about 1 to 5 mils;

selectively interrupting the scanning thereby leaving the predetermined portions of the surface of the substrate unexposed, wherein the predetermined portions left unexposed are defined by the location and dimensions of each defect;

exposing the substrate with a second exposure in the predetermined portions left unexposed in the preceding step; and interconnecting the logic elements according to the first and second exposures, thereby excluding the defects from the interconnected logic elements.

22. A method of fabricating integrated circuits comprising the steps of:

fabricating a plurality of integrated circuit logic elements on a substrate;

testing each logic element and determining the presence of defects in each logic element;

determining the location and dimensions of each defect;

providing a fixed mask;

defining electrical interconnects between the logic elements on a surface of the substrate by scanning the fixed mask, and leaving predetermined portions of the surface of the substrate unscanned, wherein the predetermined portions left unscanned are defined by the location and dimensions of each defect;

imaging the predetermined portions left unscanned in the preceding step using a direct write on wafer pattern generation tool; and interconnecting the logic elements according to the scanning of the fixed mask and the imaging using the direct write on wafer pattern generation tool, thereby excluding the defects from the interconnected logic elements.

\* \* \* \* \*